(12) United States Patent
Choi et al.

(10) Patent No.: US 8,970,044 B2
(45) Date of Patent: Mar. 3, 2015

(54) INTEGRATED CIRCUIT PACKAGING SYSTEM WITH VERTICAL INTERCONNECTS AND METHOD OF MANUFACTURE THEREOF

(75) Inventors: A Leam Choi, Ichon-si (KR); DongSam Park, Ichon si (KR); YongDuk Lee, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 778 days.

(21) Appl. No.: 13/167,631

(22) Filed: Jun. 23, 2011

(65) Prior Publication Data

US 2012/0326325 A1 Dec. 27, 2012

(51) Int. Cl.

| H01L 23/48 | (2006.01) |
|---|---|
| H01L 21/56 | (2006.01) |
| H01L 23/498 | (2006.01) |
| H01L 25/10 | (2006.01) |
| H01L 25/03 | (2006.01) |
| H01L 25/00 | (2006.01) |
| H01L 21/48 | (2006.01) |
| H01L 23/31 | (2006.01) |
| H01L 23/00 | (2006.01) |

(52) U.S. Cl.
CPC .......... *H01L 21/565* (2013.01); *H01L 21/561* (2013.01); *H01L 23/49811* (2013.01); *H01L 25/105* (2013.01); *H01L 25/03* (2013.01); *H01L 25/50* (2013.01); *H01L 21/4853* (2013.01); *H01L 23/3128* (2013.01); *H01L 24/97* (2013.01); *H01L 2224/32225* (2013.01); *H01L 2224/48227* (2013.01); *H01L 2224/73204* (2013.01); *H01L 2224/73253* (2013.01); *H01L 2224/73265* (2013.01); *H01L 2224/97* (2013.01); *H01L 2924/01029* (2013.01); *H01L 24/16* (2013.01); *H01L 24/81* (2013.01); *H01L 2224/16225* (2013.01); *H01L 2924/15311* (2013.01); *H01L 2924/19107* (2013.01); *H01L 2225/1023* (2013.01); *H01L 2225/1058* (2013.01); *H01L 2924/3511* (2013.01); *H01L 2924/3025* (2013.01)
USPC ............ 257/774; 257/E21.502; 257/E23.011; 438/127

(58) Field of Classification Search
USPC ............ 257/774, E21.502, E23.011; 438/127
See application file for complete search history.

(56) References Cited

U.S. PATENT DOCUMENTS

| 6,946,325 B2 | 9/2005 | Yean et al. | |
|---|---|---|---|
| 7,208,825 B2 | 4/2007 | Pu et al. | |
| 7,548,430 B1 | 6/2009 | Huemoeller et al. | |
| 2004/0178495 A1* | 9/2004 | Yean et al. | 257/723 |
| 2010/0207262 A1 | 8/2010 | Park et al. | |
| 2010/0289133 A1* | 11/2010 | Chao et al. | 257/692 |
| 2011/0147901 A1 | 6/2011 | Huang et al. | |
| 2012/0313209 A1* | 12/2012 | Oganesian | 257/443 |

OTHER PUBLICATIONS

U.S. Appl. No. 12/890,371, filed Sep. 2010, Pagaila.

* cited by examiner

*Primary Examiner* — Marc Armand
(74) *Attorney, Agent, or Firm* — Ishimaru & Associates LLP

(57) ABSTRACT

A method of manufacture of an integrated circuit packaging system includes: providing a substrate; mounting an integrated circuit over the substrate; forming an encapsulation over the integrated circuit, the encapsulation having an encapsulation interior sidewall; forming a peripheral non-horizontal conductive plate directly on the encapsulation interior sidewall; and forming a peripheral vertical conductor directly on the peripheral non-horizontal conductive plate and the substrate.

20 Claims, 6 Drawing Sheets

# INTEGRATED CIRCUIT PACKAGING SYSTEM WITH VERTICAL INTERCONNECTS AND METHOD OF MANUFACTURE THEREOF

TECHNICAL FIELD

The present invention relates generally to an integrated circuit packaging system, and more particularly to a system for an integrated circuit packaging system with interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting an integrated circuit over the substrate; forming an encapsulation over the integrated circuit, the encapsulation having an encapsulation interior sidewall; forming a peripheral non-horizontal conductive plate directly on the encapsulation interior sidewall; and forming a peripheral vertical conductor directly on the peripheral non-horizontal conductive plate and the substrate.

The present invention provides an integrated circuit packaging system, including: a substrate; an integrated circuit over the substrate; an encapsulation over the integrated circuit, the encapsulation having an encapsulation interior sidewall; a peripheral non-horizontal conductive plate directly on the encapsulation interior sidewall; and a peripheral vertical conductor directly on the peripheral non-horizontal conductive plate and the substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
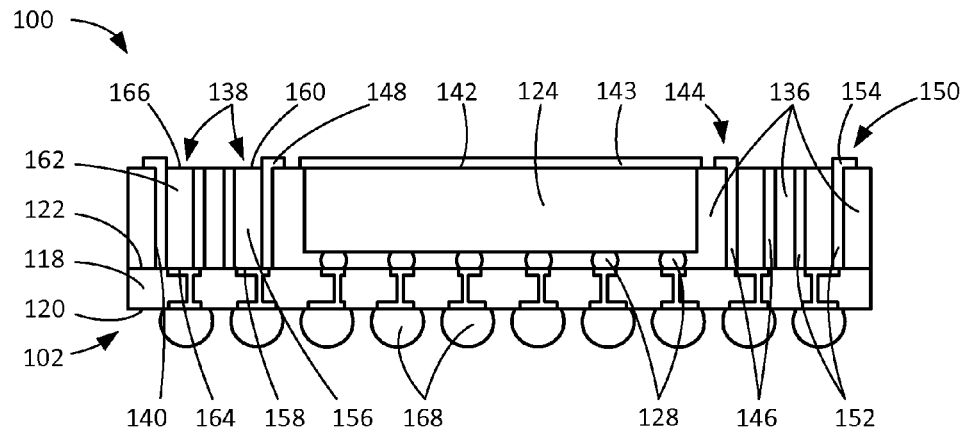
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

A flip-chip (FC) package can have, for example, a minimum of 0.5 millimeters (mm) mold cap thickness. Problems can occur since it is difficult to have copper (Cu) plate in top solder pad hole. Embodiments of the present invention provide answers or solutions to the problems.

Figure 2:
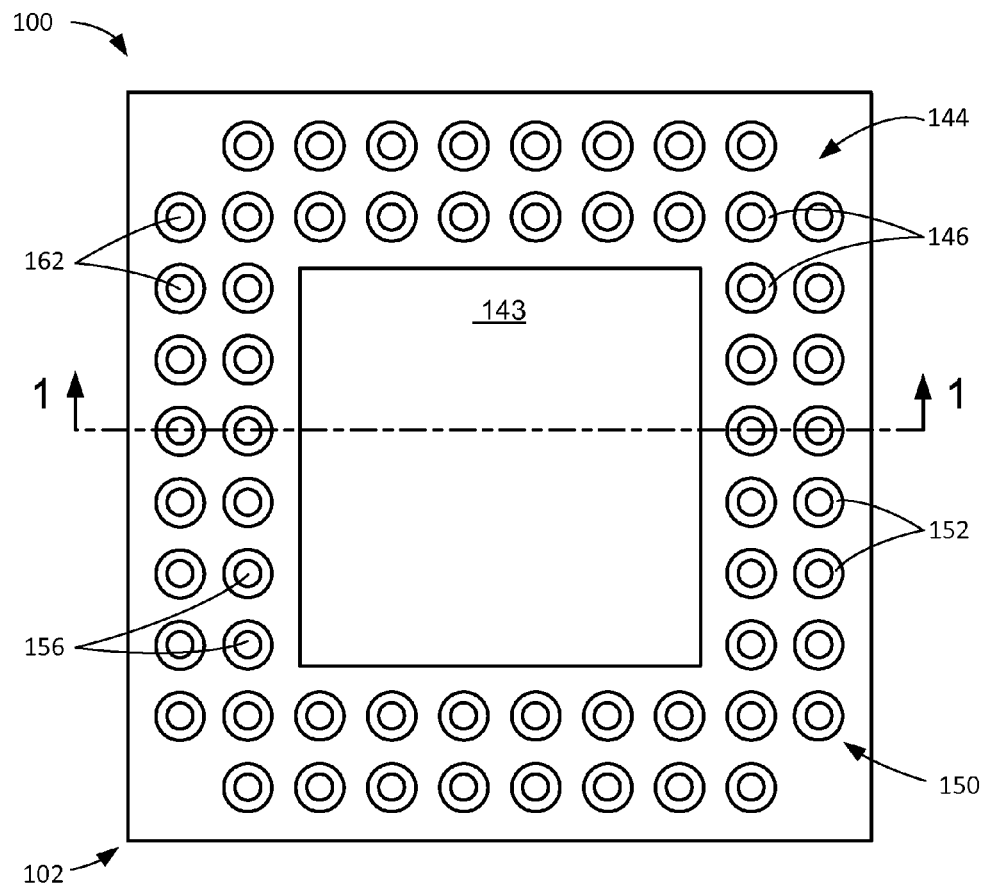
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can represent a package-on-package (POP) with mold through holes having non-copper filled plating and solder printed interconnection. The integrated circuit packaging system 100 can represent a semiconductor package that does not include an embedded interposer that is needed for subsequent formation of a redistribution layer (RDL) on top of the package.

The integrated circuit packaging system 100 can include a base package 102, which is defined as a semiconductor package. The integrated circuit packaging system 100 can include another package (not shown) that can be mounted over the base package 102.

The base package 102 can include a substrate 118 having a substrate bottom side 120 and a substrate top side 122 opposite the substrate bottom side 120. The substrate 118 is defined as a support structure for mounting and connecting an integrated circuit thereto including providing electrical connections through the support structure. The substrate 118 can include a number of pads, vias, conductive layers, or a combination thereof to provide electrical connectivity between the substrate bottom side 120 and the substrate top side 122.

The base package 102 can include an integrated circuit 124, which is defined as a semiconductor device having a number of integrated transistors interconnected to form active circuits. The integrated circuit 124 can be mounted over the substrate 118.

The base package 102 can include internal connectors 128 attached to the integrated circuit 124 and the substrate 118. The internal connectors 128 are defined as electrically conductive connectors for connecting an integrated circuit to another system level.

The base package 102 can include an encapsulation 136, which is defined as a package cover of a semiconductor package to seal an integrated circuit providing mechanical and environmental protection. The encapsulation 136 can be formed over the substrate 118 and a portion of the integrated circuit 124. The encapsulation 136 can be formed with a thermally conductive material for providing heat conduction away from the integrated circuit 124.

The encapsulation 136 can include encapsulation holes 138, which are defined as non-horizontal openings through the encapsulation 136. The encapsulation 136 can include encapsulation interior sidewalls 140, which are defined as internal sides of the encapsulation 136 that horizontally bound the encapsulation holes 138.

The encapsulation 136 can include an encapsulation top side 142, which is defined as a top extent of the encapsulation 136. A plane of the encapsulation top side 142 can be coplanar with a plane of an inactive side of the integrated circuit 124.

The base package 102 can include a heat slug 143, which is defined as a thermally conductive plate that helps dissipate heat away from a semiconductor device. The heat slug 143 can be attached to or directly on an inactive side or a backside of a flip chip, depicted as the integrated circuit 124. For example, the heat slug 143 can be formed with a thermally conductive material including a metallic material or a metal alloy. For a specific example, the heat slug 143 can be formed with a layer of copper.

The base package 102 can include an interior shield structure 144 integrally formed with interior non-horizontal conductive plates 146 and interior non-vertical conductive plates 148. The interior shield structure 144 is defined as a structure that shields electromagnetic interferences.

The interior shield structure 144 can be formed at an interior portion of the base package 102. The interior shield structure 144 can be formed over and surrounding the integrated circuit 124. The interior shield structure 144 can provide a thermal conduction path for heat to dissipate away from the integrated circuit 124 and through the encapsulation 136 to the interior shield structure 144.

The interior non-horizontal conductive plates 146 are defined as conductive layers formed at an interior portion of the base package 102. The interior non-horizontal conductive plates 146 can be formed horizontally surrounding the integrated circuit 124.

One of the interior non-horizontal conductive plates 146, such as a first interior non-horizontal conductive plate, can be formed within one of the encapsulation holes 138, such as a first encapsulation hole, and directly on one of the encapsulation interior sidewalls 140, such as a first encapsulation interior sidewall. Another of the interior non-horizontal conductive plates 146, such as a second interior non-horizontal conductive plate, can be formed within another of the encapsulation holes 138, such as a second encapsulation hole, and directly on another of the encapsulation interior sidewalls 140, such as a second encapsulation interior sidewall.

For a specific example, the interior non-horizontal conductive plates 146 can be formed vertically extending from the substrate top side 122 to the encapsulation top side 142. For another specific example, the interior non-horizontal conductive plates 146 can include planar surfaces.

The interior non-vertical conductive plates 148 are defined as conductive layers formed at an interior portion of the base package 102. The interior non-vertical conductive plates 148 can be formed above the integrated circuit 124. The interior non-vertical conductive plates 148 can be formed directly on a portion of the encapsulation top side 142.

The interior non-vertical conductive plates 148 can surround the heat slug 143. The interior non-vertical conductive plates 148 can be isolated from the heat slug 143. Each of the interior non-vertical conductive plates 148 can represent an overhang extending from and over each of the interior non-horizontal conductive plates 146.

A horizontal end of one of the interior non-vertical conductive plates 148, such as a first interior non-vertical conductive plate, can be connected to a vertical end of one of the interior non-horizontal conductive plates 146, such as the first interior non-horizontal conductive plate. A horizontal end of another of the interior non-vertical conductive plates 148, such as a second interior non-vertical conductive plate, can be connected to a vertical end of another of the interior non-horizontal conductive plates 146, such as the second interior non-horizontal conductive plate.

For a specific example, the interior non-vertical conductive plates 148 can be formed horizontally parallel an inactive side or an active side of the integrated circuit 124. For another specific example, the interior non-vertical conductive plates 148 can include planar surfaces.

The base package 102 can include peripheral shield structures 150 having peripheral non-horizontal conductive plates 152 and peripheral non-vertical conductive plates 154. The peripheral shield structures 150 are defined as structures that shield electromagnetic interferences. Each of the peripheral shield structures 150 can be integrally formed with one of the peripheral non-horizontal conductive plates 152 and one of the peripheral non-vertical conductive plates 154.

The peripheral shield structures 150 can be formed at exterior portions of the base package 102. The peripheral shield structures 150 can provide thermal conduction paths for heat to dissipate away from the integrated circuit 124 and through the encapsulation 136 to the peripheral shield structures 150.

One of the peripheral shield structures 150, such as a first peripheral shield structure, can be adjacent the interior shield structure 144. The first peripheral shield structure can be further away from the integrated circuit 124 than the interior shield structure 144. The interior shield structure 144 can be between the first peripheral shield structure and the integrated circuit 124.

Another of the peripheral shield structures 150, such as a second peripheral shield structure, can be adjacent the interior shield structure 144. The second peripheral shield structure can be further away from the integrated circuit 124 than the interior shield structure 144. The interior shield structure 144 can be between the second peripheral shield structure and the integrated circuit 124.

The peripheral non-horizontal conductive plates 152 are defined as conductive layers formed at an exterior portion of the base package 102. The peripheral non-horizontal conductive plates 152 can be formed horizontally surrounding the interior non-horizontal conductive plates 146.

One of the peripheral non-horizontal conductive plates 152, such as a first peripheral non-horizontal conductive plate, can be adjacent one of the interior non-horizontal conductive plates 146, such as the first interior non-horizontal conductive plate. Another of the peripheral non-horizontal conductive plates 152, such as a second peripheral non-horizontal conductive plate, can be adjacent another of the interior non-horizontal conductive plates 146, such as the second interior non-horizontal conductive plate.

One of the peripheral non-horizontal conductive plates 152, such as the first peripheral non-horizontal conductive plate, can be formed within one of the encapsulation holes 138, such as a third encapsulation hole. The first peripheral non-horizontal conductive plate can be directly on one of the encapsulation interior sidewalls 140, such as a third encapsulation interior sidewall.

Another of the peripheral non-horizontal conductive plates 152, such as the second peripheral non-horizontal conductive plate, can be formed within another of the encapsulation holes 138, such as a fourth encapsulation hole. The second peripheral non-horizontal conductive plate can be directly on another of the encapsulation interior sidewalls 140, such as a fourth encapsulation interior sidewall.

For a specific example, the peripheral non-horizontal conductive plates 152 can be formed vertically extending from the substrate top side 122 to the encapsulation top side 142. For another specific example, the peripheral non-horizontal conductive plates 152 can include planar surfaces.

The peripheral non-vertical conductive plates 154 are defined as conductive layers formed at an exterior portion of the base package 102. The peripheral non-vertical conductive plates 154 can be formed directly on portions of the encapsulation top side 142.

A horizontal end of one of the peripheral non-vertical conductive plates 154, such as the first peripheral non-vertical conductive plate, can be connected to a vertical end of one of the peripheral non-horizontal conductive plates 152, such as the first peripheral non-horizontal conductive plate. A horizontal end of another of the peripheral non-vertical conductive plates 154, such as the second peripheral non-vertical conductive plate, can be connected to a vertical end of another of the peripheral non-horizontal conductive plates 152, such as the second peripheral non-horizontal conductive plate.

For a specific example, the peripheral non-vertical conductive plates 154 can be formed horizontally parallel the inactive side or the active side of the integrated circuit 124. For another specific example, the peripheral non-vertical conductive plates 154 can include planar surfaces.

The base package 102 can include interior vertical conductors 156, each of which can include an interior conductor bottom side 158 and an interior conductor top side 160 opposite the interior conductor bottom side 158. The interior vertical conductors 156 are defined as electrically conductive connectors that connect the integrated circuit 124 to another system level. The substrate 118 can provide an electrical path between the interior vertical conductors 156 and the integrated circuit 124. The interior conductor bottom side 158 and the interior conductor top side 160 are defined as bottom and top extents, respectively, of each of the interior vertical conductors 156.

One of the interior vertical conductors 156, such as a first interior vertical conductor, can be formed within one of the encapsulation holes 138, such as the first encapsulation hole. The first interior vertical conductor can be formed directly on one of the interior non-horizontal conductive plates 146, such as the first interior non-horizontal conductive plate.

Another of the interior vertical conductors 156, such as a second interior vertical conductor, can be formed within another of the encapsulation holes 138, such as the second encapsulation hole. The second interior vertical conductor can be formed directly on another of the interior non-horizontal conductive plates 146, such as the second interior non-horizontal conductive plate.

The base package 102 can include peripheral vertical conductors 162, each of which can include a peripheral conductor bottom side 164 and a peripheral conductor top side 166 opposite the peripheral conductor bottom side 164. The peripheral vertical conductors 162 are defined as electrically conductive connectors that connect the integrated circuit 124 to another system level. The substrate 118 can provide an electrical path between the peripheral vertical conductors 162 and the integrated circuit 124. The peripheral conductor bottom side 164 and the peripheral conductor top side 166 are defined as bottom and top extents, respectively, of each of the peripheral vertical conductors 162. The interior vertical conductors 156 are away from the peripheral vertical conductors 162. The interior vertical conductors 156 are between the peripheral vertical conductors 162 and the integrated circuit 124.

One of the peripheral vertical conductors 162, such as a first peripheral vertical conductor, can be formed within one of the encapsulation holes 138, such as the third encapsulation hole. The first peripheral vertical conductor can be formed directly on one of the peripheral non-horizontal conductive plates 152, such as the first peripheral non-horizontal conductive plate.

Another of the peripheral vertical conductors 162, such as a second peripheral vertical conductor, can be formed within another of the encapsulation holes 138, such as the fourth encapsulation hole. The second peripheral vertical conductor can be formed directly on another of the peripheral non-horizontal conductive plates 152, such as the second peripheral non-horizontal conductive plate.

Bottom extents of the interior non-horizontal conductive plates 146, the peripheral non-horizontal conductive plates 152, and the encapsulation 136 can be directly on the substrate top side 122. The interior conductor bottom side 158 and the peripheral conductor bottom side 164 can be directly on the substrate top side 122. The encapsulation top side 142 and top extents of the interior non-horizontal conductive plates 146 and the peripheral non-horizontal conductive plates 152 can be coplanar with each other.

Bottom extents of the heat slug 143, the interior non-vertical conductive plates 148, and the peripheral non-vertical conductive plates 154 can be coplanar with each other. Top extents of the heat slug 143, the interior non-vertical conductive plates 148, and the peripheral non-vertical conductive plates 154 can be coplanar with each other.

The base package 102 can include base interconnects 168 attached to the substrate bottom side 120 to provide electrical connection between the substrate 118 and an external system (not shown). The base interconnects 168 are defined as electrically conductive connectors.

It has been discovered that the interior vertical conductors 156 directly on the interior non-horizontal conductive plates 146 and the peripheral vertical conductors 162 directly on the peripheral non-horizontal conductive plates 152 provide robust structural integrity thereby eliminating warpage.

It has been unexpectedly found that the interior non-horizontal conductive plates 146 and the peripheral non-horizontal conductive plates 152 directly on the encapsulation interior sidewalls 140 provide reduced horizontal length profile with the interior non-horizontal conductive plates 146 and the peripheral non-horizontal conductive plates 152 having reduced thicknesses, resulting in reduced manufacturing cost.

It has been unexpectedly determined that the encapsulation 136 between the interior non-horizontal conductive plates 146 and the peripheral non-horizontal conductive plates 152 improves reliability by eliminating solder ball bridges between top solder balls to be attached to the interior vertical conductors 156 and the peripheral vertical conductors 162 when a top package is mounted over the base package 102.

It has been unexpectedly recognized that the interior vertical conductors 156 and the peripheral vertical conductors 162 provide reduced pitch with the interior vertical conductors 156 and the peripheral vertical conductors 162 formed with column shapes having reduced horizontal widths.

It has been unexpectedly ascertained that the interior shield structure 144 and the peripheral shield structures 150 directly on the encapsulation top side 142 provide improved reliability since the interior shield structure 144 and the peripheral shield structures 150 provide improved electromagnetic shielding thereby eliminating electromagnetic interferences.

It has been unexpectedly identified that the integrated circuit 124 provides improved reliability since it the integrated circuit 124 is a known good die (KGD), resulting in increased yield.

It has been unexpectedly observed that the interior vertical conductors 156 and the peripheral vertical conductors 162 improve reliability since the interior vertical conductors 156 and the peripheral vertical conductors 162 are formed with solder having improved joints with pads at the substrate top side 122 compared to copper.

It has been unexpectedly detected that the heat slug 143 directly on the inactive side of the integrated circuit 124 provides improved reliability by conducting heat away from the integrated circuit 124.

Referring now to FIG. 2, therein is shown a top view of the integrated circuit packaging system 100. The top view is shown without the interior non-vertical conductive plates 148 of FIG. 1 and the peripheral non-vertical conductive plates 154 of FIG. 1. The top view depicts the base package 102 having the interior shield structure 144 with the interior non-horizontal conductive plates 146.

The heat slug 143 can be surrounded by an array of the interior non-horizontal conductive plates 146. The heat slug 143 can be isolated from the interior non-horizontal conductive plates 146. The base package 102 can include each of the interior vertical conductors 156 surrounded by and electrically connected to each of the interior non-horizontal conductive plates 146.

For illustration purposes, the interior non-horizontal conductive plates 146 and the interior vertical conductors 156 are shown with circular shapes, although it is understood that the interior non-horizontal conductive plates 146 and the interior vertical conductors 156 can include any shapes. For example, the interior non-horizontal conductive plates 146 and the interior vertical conductors 156 can include rectangular shapes including square shapes.

The base package 102 can include an array of the peripheral shield structures 150 surrounding the interior shield structure 144. Each of the peripheral shield structures 150 can include one of the peripheral non-horizontal conductive plates 152. The base package 102 can include each of the peripheral vertical conductors 162 surrounded by and electrically connected to each of the peripheral non-horizontal conductive plates 152.

For illustration purposes, the peripheral non-horizontal conductive plates 152 and the peripheral vertical conductors 162 are shown with circular shapes, although it is understood that the peripheral non-horizontal conductive plates 152 and the peripheral vertical conductors 162 can include any shapes. For example, the peripheral non-horizontal conductive plates 152 and the peripheral vertical conductors 162 can include rectangular shapes including square shapes.

Figure 3:
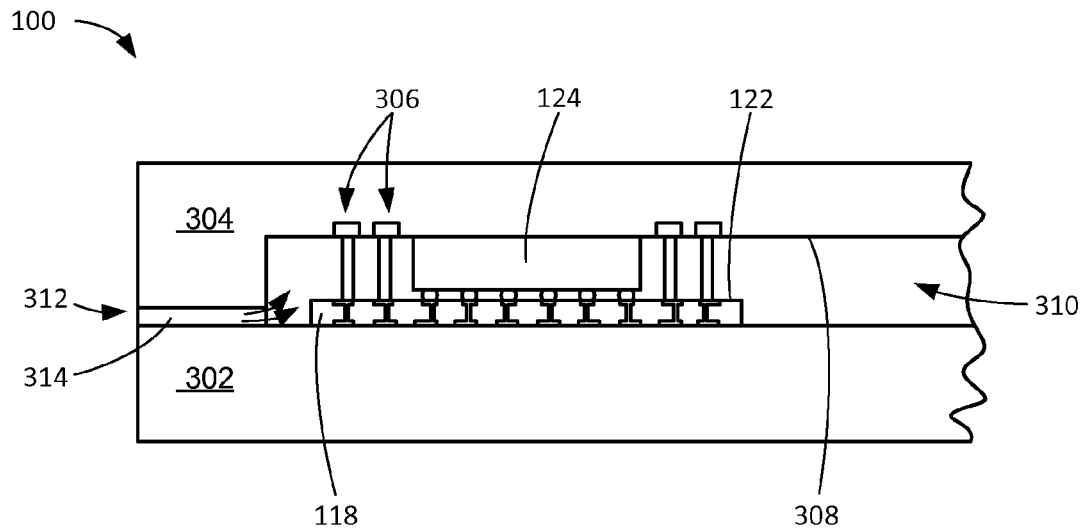
FIG. 3 is a cross-sectional view of the integrated circuit packaging system in a molding phase of manufacture in an exemplary process flow.

Referring now to FIG. 3, therein is shown a cross-sectional view of the integrated circuit packaging system 100 in a molding phase of manufacture in an exemplary process flow. The integrated circuit packaging system 100 can include a mold base 302 and a mold chase 304 to form the encapsulation 136 of FIG. 1.

The mold base 302 and the mold chase 304 provide improved reduced manufacturing time and cost since there is no need to drill after mold since laser drilling, for example, needs more time and cost. Transfer molding with the mold base 302 and the mold chase 304 is efficient and less difficult compared to pressing method when encapsulating flip chip bump surroundings of at a flip chip bottom. For example, the mold base 302 and the mold chase 304 can represent a bottom mold plate and a top mold plate, respectively.

The mold chase 304 can include mold pins 306 attached to an internal horizontal side 308 of the mold chase 304. The mold pins 306 are provided to form the encapsulation holes 138 of FIG. 1. The mold chase 304 can include a recess 310 vertically bounded by the internal horizontal side 308.

The integrated circuit 124 can be mounted over the substrate 118. The integrated circuit 124 and the substrate 118 can be mounted over the mold base 302. The mold chase 304 can be securely mounted over the mold base 302 with the integrated circuit 124 and the substrate 118 within the recess 310. The mold pins 306 can be positioned directly on the substrate top side 122.

The integrated circuit packaging system 100 can include a transfer hole 312 between the mold base 302 and the mold chase 304. The transfer hole 312 is provided for transferring a mold material 314, including an epoxy mold compound (EMC) or an encapsulant, into the recess 310 in a direction shown with arrows to form the encapsulation 136.

As an example, the substrate 118 can represent a support structure including a printed circuit board (PCB), a laminated substrate, or a ceramic substrate. As another example, the integrated circuit 124 can represent a semiconductor device including a flip chip, an integrated circuit die, or a wirebond integrated circuit. As a further example, the integrated circuit 124 can include an active side facing the substrate top side 122.

Figure 4:
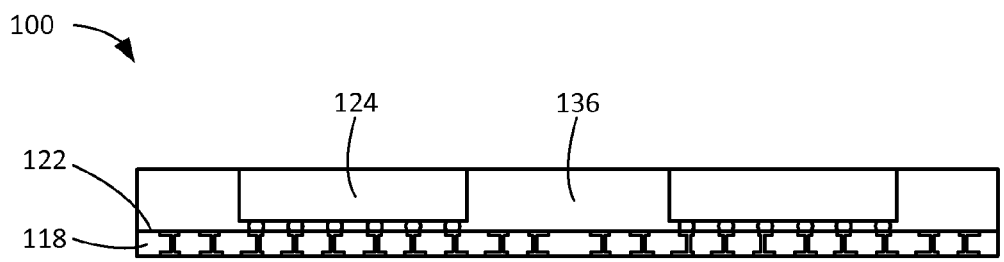
FIG. 4 is a cross-sectional view of the integrated circuit packaging system in a molding phase of manufacture in another exemplary process flow.

Referring now to FIG. 4, therein is shown a cross-sectional view of the integrated circuit packaging system 100 in a molding phase of manufacture in another exemplary process flow. The integrated circuit 124 can be mounted over the substrate 118. The encapsulation 136 can be formed over the substrate 118 and a portion of the integrated circuit 124.

The integrated circuit packaging system 100 can include a removal process for removing a portion of the encapsulation 136. For example, the removal process can include a removal method including laser drilling or any other mechanical method.

As an example, the substrate 118 can represent a support structure including a printed circuit board (PCB), a laminated substrate, or a ceramic substrate. As another example, the integrated circuit 124 can represent a semiconductor device including a flip chip, an integrated circuit die, or a wirebond integrated circuit. As a further example, the integrated circuit 124 can include an active side facing the substrate top side 122.

Figure 5:
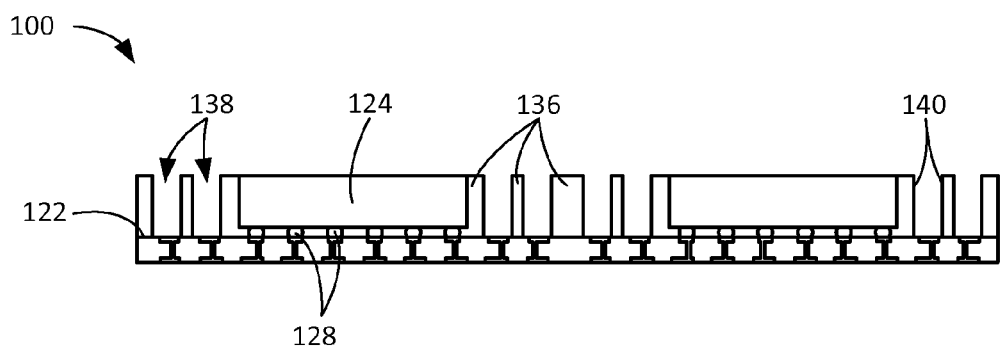
FIG. 5 is the structure of FIG. 3 or FIG. 4 after the molding phase.

Referring now to FIG. 5, therein is shown the structure of FIG. 3 or FIG. 4 after the molding phase. FIG. 5 depicts the encapsulation 136 having the encapsulation holes 138 bounded by the encapsulation interior sidewalls 140 and exposing portions of the substrate top side 122. For example, the encapsulation holes 138 can represent vias.

The encapsulation 136 can cover the substrate top side 122, a portion of the integrated circuit 124, and the internal connectors 128. The encapsulation 136 can control warpage because of the encapsulation 136 can cover a bare substrate area, depicted as an area of the substrate top side 122 that is not covered before the molding phase.

Figure 6:
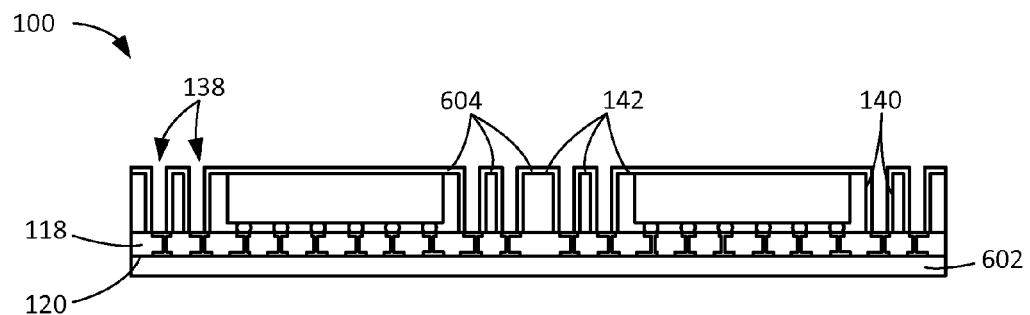
FIG. 6 is the structure of FIG. 5 in a plating phase.

Referring now to FIG. 6, therein is shown the structure of FIG. 5 in a plating phase. The integrated circuit packaging system 100 can include a bottom lamination layer 602, which is defined as a layer resistant to a removal process including a chemical or mechanical method. The bottom lamination layer 602 can be attached to the substrate 118. The bottom lamination layer 602 can cover the substrate bottom side 120. For example, the bottom lamination layer 602 can represent a bottom dry film (D/F) lamination.

The integrated circuit packaging system 100 can include a conductive plate 604, which is defined as a layer formed with an electrically conductive material. The conductive plate 604 can be plated directly on the encapsulation interior sidewalls 140 and the encapsulation top side 142.

For example, the conductive plate 604 can be formed with an electrically conductive material including copper (Cu), a metallic material, or a metal alloy. Also for example, the conductive plate 604 can include a thickness of approximately 20 micrometers (um) to 30 micrometers (um), providing improved cost merit or reduced manufacturing cost with the conductive plate 604 having reduced thickness since there is no need to entirely plate the encapsulation holes 138.

Figure 7:
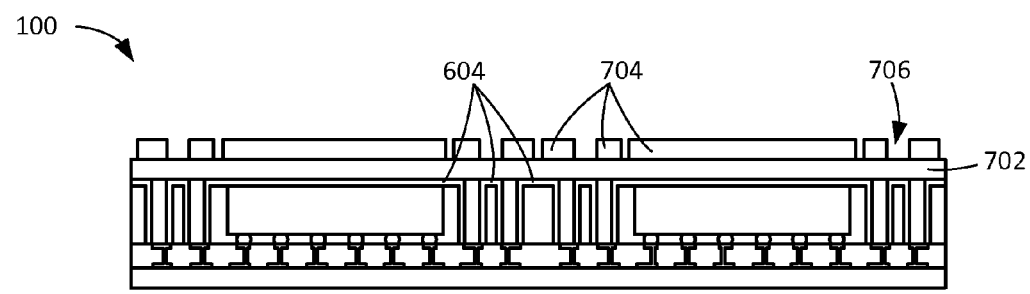
FIG. 7 is the structure of FIG. 6 in a developing phase.

Referring now to FIG. 7, therein is shown the structure of FIG. 6 in a developing phase. The integrated circuit packaging system 100 can include a top lamination layer 702, which is defined as a layer resistant to a removal process including a chemical or mechanical method.

The top lamination layer 702 can be attached to the conductive plate 604. The top lamination layer 702 can cover a top side of the conductive plate 604. For example, the top lamination layer 702 can represent a top dry film lamination.

The integrated circuit packaging system 100 can include a mask 704 having mask holes 706 through the mask 704. The integrated circuit packaging system 100 can include a developing method to pattern the top lamination layer 702 with the mask 704. Portions of the top lamination layer 702 under the mask holes 706 can be removed in a subsequent phase.

Figure 8:
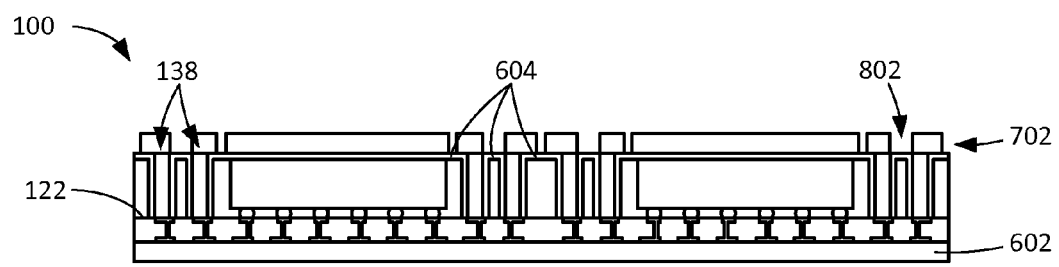
FIG. 8 is the structure of FIG. 7 in a removal phase.

Referring now to FIG. 8, therein is shown the structure of FIG. 7 in a removal phase. FIG. 8 depicts the top lamination layer 702 partially removed with the mask 704 of FIG. 7 forming top lamination layer holes 802 through the top lamination layer 702. FIG. 8 also depicts the mask 704 removed.

Portions of the conductive plate 604 under the top lamination layer holes 802 can be removed with a plate removal process including etching or any other chemical removal process. Other portions of the conductive plate 604 within the encapsulation holes 138 can be removed with the plate removal process to expose portions of the substrate top side 122. For a specific example, the plate removal process can include copper etching.

The bottom lamination layer 602 and the top lamination layer 702 can be removed with a lamination removal process including stripping or any other mechanical removal process. For a specific example, the lamination removal process can include dry film stripping.

Figure 9:
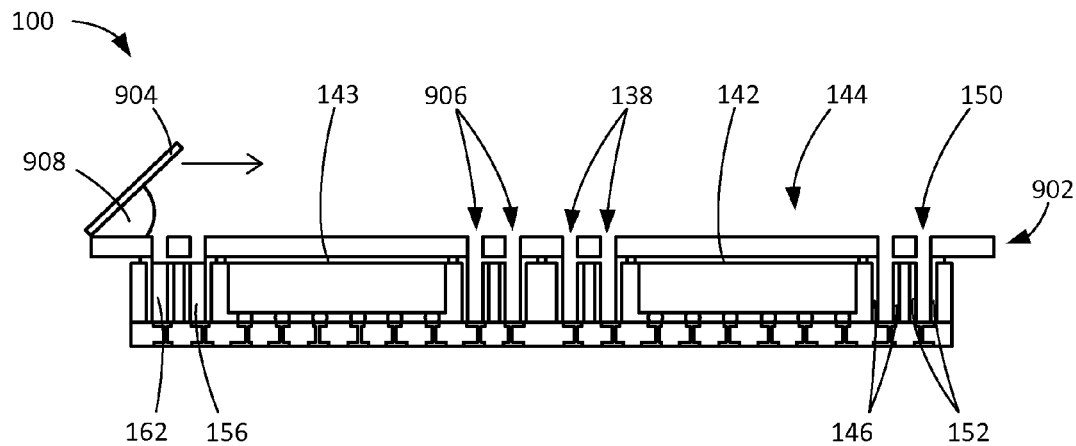
FIG. 9 is the structure of FIG. 8 in a conductor-forming phase.

Referring now to FIG. 9, therein is shown the structure of FIG. 8 in a conductor-forming phase. FIG. 9 depicts the bottom lamination layer 602 of FIG. 6 and the top lamination layer 702 of FIG. 7 removed. FIG. 9 also depicts the heat slug 143, the interior shield structure 144, and the peripheral shield structures 150 formed with portions of the conductive plate 604 of FIG. 6 removed in FIG. 8. The interior shield structure 144 and the peripheral shield structures 150 directly on the encapsulation top side 142 can screen electromagnetic waves.

The integrated circuit packaging system 100 can include a printing method with a stencil 902 and a squeegee 904. The stencil 902 is defined as a device that is perforated for printing purposes. The stencil 902 can include stencil apertures 906, which are defined as perforations through which a conductive material 908 can pass.

The squeegee 904 is defined as a device that is used to spread the conductive material 908 on the stencil 902 in a direction shown by an arrow. The conductive material 908 is defined as an electrically conductive material including solder, a metallic material, or a metal alloy.

For a specific example, the conductive material 908 can represent a solder paste. For another specific example, the printing method can include solder paste printing.

The stencil 902 can be positioned over the interior shield structure 144 and the peripheral shield structures 150 such that the stencil apertures 906 can be aligned with the encapsulation holes 138. The conductive material 908 can be applied into the encapsulation holes 138 forming the interior vertical conductors 156 and the peripheral vertical conductors 162.

The interior vertical conductors 156 and the peripheral vertical conductors 162 can be directly on the interior non-horizontal conductive plates 146 and the peripheral non-horizontal conductive plates 152, respectively. For example, the interior vertical conductors 156 and the peripheral vertical conductors 162 can include vertical shapes of columns, pillars, or studs, not shapes of balls.

Figure 10:
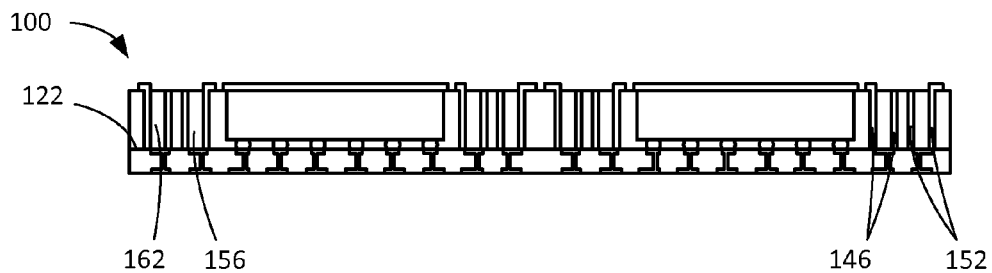
FIG. 10 is the structure of FIG. 9 in a reflowing phase.

Referring now to FIG. 10, therein is shown the structure of FIG. 9 in a reflowing phase. FIG. 10 depicts all of the interior vertical conductors 156 and the peripheral vertical conductors 162 formed directly on all of the interior non-horizontal conductive plates 146 and the peripheral non-horizontal conductive plates 152, respectively.

The interior vertical conductors 156 and the peripheral vertical conductors 162 can be formed to receive a top package or a device. For example, gold (Au) pads at the substrate top side 122 can have improved joint with solder, depicted as the interior vertical conductors 156 and the peripheral vertical conductors 162, than copper (Cu) because copper has oxidation when exposed to air.

A reflow process can be performed to form metallurgical joints between the interior vertical conductors 156 and the interior non-horizontal conductive plates 146 as well as between the interior vertical conductors 156 and portions of the substrate top side 122. The reflow process can also be performed to form metallurgical joints between the peripheral vertical conductors 162 and the peripheral non-horizontal conductive plates 152 as well as between the peripheral vertical conductors 162 and portions of the substrate top side 122.

Figure 11:
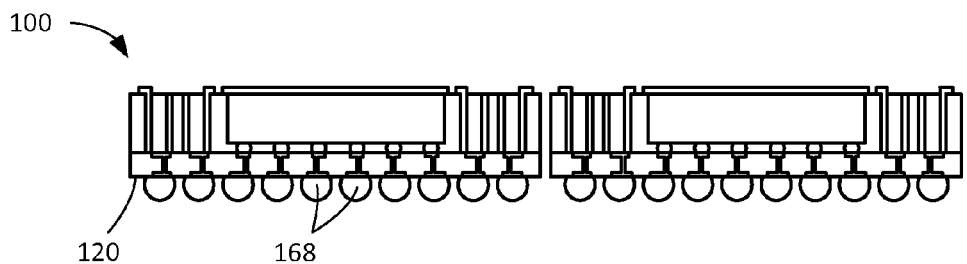
FIG. 11 is the structure of FIG. 10 in a singulation phase.

Referring now to FIG. 11, therein is shown the structure of FIG. 10 in a singulation phase. The integrated circuit packaging system 100 can include an attachment process to attach the base interconnects 168 to the substrate bottom side 120. For example, the attachment process can include solder ball mount.

The integrated circuit packaging system 100 can include a package singulation process to produce individual units or packages of the integrated circuit packaging system 100. The package singulation process can include a mechanical or optical process.

Figure 12:
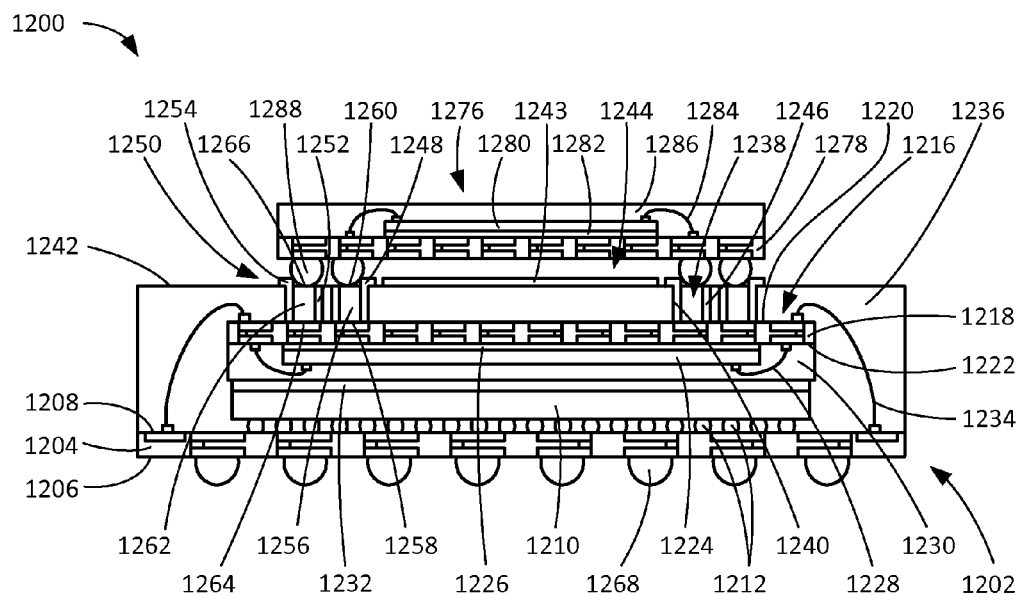
FIG. 12 is a cross-sectional view of an integrated circuit packaging system in a second embodiment of the present invention.

Referring now to FIG. 12, therein is shown a cross-sectional view of an integrated circuit packaging system 1200 in a second embodiment of the present invention. The integrated circuit packaging system 1200 can represent a fan-in package-on-package (Fi-POP) package.

The integrated circuit packaging system 1200 can include a base package 1202, which is defined as a semiconductor package. The base package 1202 can include a base substrate 1204 having a base substrate bottom side 1206 and a base substrate top side 1208 opposite the base substrate bottom side 1206. The base substrate 1204 is defined as a support structure for mounting and connecting an integrated circuit thereto including providing electrical connections through the support structure.

The base package 1202 can include a base integrated circuit 1210, which is defined as a semiconductor device having a number of integrated transistors interconnected to form active circuits. The base integrated circuit 1210 can be mounted over the base substrate 1204.

The base package 1202 can include first base connectors 1212 attached to an active side of the base integrated circuit 1210 and the base substrate top side 1208. The first base connectors 1212 are defined as electrically conductive connectors for connecting an integrated circuit to another system level.

The integrated circuit packaging system 1200 can include an internal package 1216, which is defined as a semiconductor package. The internal package 1216 can include an internal substrate 1218 having an internal substrate bottom side 1220 and an internal substrate top side 1222 opposite the internal substrate bottom side 1220.

The internal substrate 1218 is defined as a support structure for mounting and connecting an integrated circuit thereto including providing electrical connections through the support structure. The internal substrate 1218 can include a number of pads, vias, conductive layers, or a combination thereof to provide electrical connectivity between the internal substrate bottom side 1220 and the internal substrate top side 1222.

The internal package 1216 can include an internal integrated circuit 1224, which is defined as a semiconductor device having a number of integrated transistors interconnected to form active circuits. The internal integrated circuit 1224 can be mounted over the internal substrate 1218 with an internal attach layer 1226, which is defined as a layer formed with an attach material for attaching an integrated circuit.

The internal package 1216 can include internal connectors 1228 attached to the internal integrated circuit 1224 and the internal substrate 1218. The internal connectors 1228 are defined as electrically conductive connectors for connecting an integrated circuit to another component or another system level.

The internal package 1216 can include an internal encapsulation 1230, which is defined as a package cover of a semiconductor package to seal an integrated circuit providing mechanical and environmental protection. The internal encapsulation 1230 can be formed over and covering the internal substrate top side 1222, the internal integrated circuit 1224, the internal attach layer 1226, and the internal connectors 1228.

The base package 1202 can include a base attach layer 1232 attached to a top side of the internal encapsulation 1230 and an inactive side of the base integrated circuit 1210 with the internal package 1216 in a vertically inverted position.

The base package 1202 can include second base connectors 1234 electrically connected or attached to the internal substrate bottom side 1220 and the base substrate top side 1208.

The base package 1202 can include a base encapsulation 1236, which is defined as a package cover of a semiconductor package to seal an integrated circuit providing mechanical and environmental protection. The base encapsulation 1236 can be formed over the base substrate 1204, the base integrated circuit 1210, the internal package 1216, and the second base connectors 1234. The base encapsulation 1236 can be formed with a thermally conductive material for providing heat conduction away from the base integrated circuit 1210 and the internal package 1216.

The base encapsulation 1236 can include base encapsulation holes 1238, which are vertical openings through the base encapsulation 1236. The base encapsulation 1236 can include base encapsulation interior sidewalls 1240, which are defined as internal sides of the base encapsulation 1236 that horizontally bound the base encapsulation holes 1238. The base encapsulation 1236 can include a base encapsulation top side 1242, which is defined as a top extent of the base encapsulation 1236.

The base package 1202 can include a heat slug 1243, which is defined as a thermally conductive plate that helps dissipate heat away from a semiconductor device or a semiconductor package. The heat slug 1243 can be attached to or directly on a central portion of the base encapsulation top side 1242. For example, the heat slug 1243 can be formed with a thermally conductive material including a metallic material or a metal alloy. For a specific example, the heat slug 1243 can be formed with a layer of copper.

The base package 1202 can include an interior shield structure 1244 integrally formed with interior non-horizontal conductive plates 1246 and interior non-vertical conductive plates 1248. The interior shield structure 1244 is defined as a structure that shields electromagnetic interferences.

The interior shield structure 1244 can be formed at an interior portion of the base package 1202. The interior shield structure 1244 can be formed over the internal substrate 1218 of the internal package 1216.

The interior shield structure 1244 can provide a thermal conduction path for heat to dissipate away from the internal integrated circuit 1224, and through the internal substrate 1218 and the base encapsulation 1236 to the interior shield structure 1244. The interior shield structure 1244 can also provide another thermal conduction path for heat to dissipate away from the base integrated circuit 1210 and through the base encapsulation 1236 to the interior shield structure 1244.

The interior non-horizontal conductive plates 1246 are defined as conductive layers formed at an interior portion of the base package 1202. The interior non-horizontal conductive plates 1246 can be formed directly on the internal package 1216.

One of the interior non-horizontal conductive plates 1246, such as a first interior non-horizontal conductive plate, can be formed within one of the base encapsulation holes 1238, such as a first encapsulation hole, and directly on one of the base encapsulation interior sidewalls 1240, such as a first encapsulation interior sidewall. Another of the interior non-horizontal conductive plates 1246, such as a second interior non-horizontal conductive plate, can be formed within another of the base encapsulation holes 1238, such as a second encapsulation hole, and directly on another of the base encapsulation interior sidewalls 1240, such as a second encapsulation interior sidewall.

For a specific example, the interior non-horizontal conductive plates 1246 can be formed vertically extending from the internal substrate bottom side 1220 to the base encapsulation top side 1242. For another specific example, the interior non-horizontal conductive plates 1246 can include planar surfaces.

The interior non-vertical conductive plates 1248 are defined as conductive layers formed at an interior portion of the base package 1202. The interior non-vertical conductive plates 1248 can be formed over the internal substrate bottom side 1220. The interior non-vertical conductive plates 1248 can be formed directly on a portion of the base encapsulation top side 1242.

The interior non-vertical conductive plates 1248 can surround the heat slug 1243. Each of the interior non-vertical conductive plates 1248 can represent an overhang extending from and over each of the interior non-horizontal conductive plates 1246.

A horizontal end of one of the interior non-vertical conductive plates 1248, such as a first interior non-vertical conductive plate, can be connected to a vertical end of one of the interior non-horizontal conductive plates 1246, such as the first interior non-horizontal conductive plate. A horizontal end of another of the interior non-vertical conductive plates 1248, such as a second interior non-vertical conductive plate, can be connected to a vertical end of another of the interior non-horizontal conductive plates 1246, such as the second interior non-horizontal conductive plate.

For a specific example, the interior non-vertical conductive plates 1248 can be formed horizontally parallel the internal substrate bottom side 1220. For another specific example, the interior non-vertical conductive plates 1248 can include planar surfaces.

The base package 1202 can include peripheral shield structures 1250 having peripheral non-horizontal conductive plates 1252 and peripheral non-vertical conductive plates 1254. The peripheral shield structures 1250 are defined as structures that shield electromagnetic interferences. Each of the peripheral shield structures 1250 can be integrally formed with one of the peripheral non-horizontal conductive plates 1252 and one of the peripheral non-vertical conductive plates 1254.

The peripheral shield structures 1250 can be formed at exterior portions of the base package 1202. The peripheral shield structures 1250 can provide thermal conduction paths for heat to dissipate away from the internal integrated circuit 1224, and through the internal substrate 1218 and the base encapsulation 1236 to the peripheral shield structures 1250. The peripheral shield structures 1250 can also provide another thermal conduction path for heat to dissipate away from the base integrated circuit 1210 and through the base encapsulation 1236 to the peripheral shield structures 1250.

One of the peripheral shield structures 1250, such as a first peripheral shield structure, can be adjacent the interior shield structure 1244. Another of the peripheral shield structures 1250, such as a second peripheral shield structure, can be adjacent the interior shield structure 1244.

The peripheral non-horizontal conductive plates 1252 are defined as conductive layers formed at an exterior portion of the base package 1202. The peripheral non-horizontal conductive plates 1252 can be formed horizontally surrounding the interior non-horizontal conductive plates 1246.

One of the peripheral non-horizontal conductive plates 1252, such as a first peripheral non-horizontal conductive plate, can be adjacent one of the interior non-horizontal conductive plates 1246, such as the first interior non-horizontal conductive plate. Another of the peripheral non-horizontal conductive plates 1252, such as a second peripheral non-horizontal conductive plate, can be adjacent another of the interior non-horizontal conductive plates 1246, such as the second interior non-horizontal conductive plate.

One of the peripheral non-horizontal conductive plates 1252, such as the first peripheral non-horizontal conductive plate, can be formed within one of the base encapsulation holes 1238, such as a third encapsulation hole. The first peripheral non-horizontal conductive plate can be directly on one of the base encapsulation interior sidewalls 1240, such as a third encapsulation interior sidewall.

Another of the peripheral non-horizontal conductive plates 1252, such as the second peripheral non-horizontal conductive plate, can be formed within another of the base encapsulation holes 1238, such as a fourth encapsulation hole. The second peripheral non-horizontal conductive plate can be directly on another of the base encapsulation interior sidewalls 1240, such as a fourth encapsulation interior sidewall.

For a specific example, the peripheral non-horizontal conductive plates 1252 can be formed vertically extending from the internal substrate bottom side 1220 to the base encapsulation top side 1242. For another specific example, the peripheral non-horizontal conductive plates 1252 can include planar surfaces.

The peripheral non-vertical conductive plates 1254 are defined as conductive layers formed at an exterior portion of the base package 1202. The peripheral non-vertical conductive plates 1254 can be formed directly on portions of the base encapsulation top side 1242.

A horizontal end of one of the peripheral non-vertical conductive plates 1254, such as the first peripheral non-vertical conductive plate, can be connected to a vertical end of one of the peripheral non-horizontal conductive plates 1252, such as the first peripheral non-horizontal conductive plate. A horizontal end of another of the peripheral non-vertical conductive plates 1254, such as the second peripheral non-vertical conductive plate, can be connected to a vertical end of another of the peripheral non-horizontal conductive plates 1252, such as the second peripheral non-horizontal conductive plate.

For a specific example, the peripheral non-vertical conductive plates 1254 can be formed horizontally parallel the internal substrate bottom side 1220. For another specific example, the peripheral non-vertical conductive plates 1254 can include planar surfaces.

The base package 1202 can include interior vertical conductors 1256, each of which can include an interior conductor bottom side 1258 and an interior conductor top side 1260 opposite the interior conductor bottom side 1258. The interior vertical conductors 1256 are defined as electrically conductive connectors that connect the internal integrated circuit 1224 to another system level. The internal substrate 1218 can provide an electrical path between the interior vertical conductors 1256 and the internal integrated circuit 1224. The interior conductor bottom side 1258 and the interior conductor top side 1260 are defined as bottom and top extents, respectively, of each of the interior vertical conductors 1256.

One of the interior vertical conductors 1256, such as a first interior vertical conductor, can be formed within one of the base encapsulation holes 1238, such as the first encapsulation hole. The first interior vertical conductor can be formed directly on one of the interior non-horizontal conductive plates 1246, such as the first interior non-horizontal conductive plate.

Another of the interior vertical conductors 1256, such as a second interior vertical conductor, can be formed within another of the base encapsulation holes 1238, such as the second encapsulation hole. The second interior vertical conductor can be formed directly on another of the interior non-horizontal conductive plates 1246, such as the second interior non-horizontal conductive plate.

The base package 1202 can include peripheral vertical conductors 1262, each of which can include a peripheral conductor bottom side 1264 and a peripheral conductor top side 1266 opposite the peripheral conductor bottom side 1264. The peripheral vertical conductors 1262 are defined as electrically conductive connectors that connect the internal integrated circuit 1224 to another system level. The internal substrate 1218 can provide an electrical path between the peripheral vertical conductors 1262 and the internal integrated circuit 1224. The peripheral conductor bottom side 1264 and the peripheral conductor top side 1266 are defined as bottom and top extents, respectively, of each of the peripheral vertical conductors 1262.

One of the peripheral vertical conductors 1262, such as a first peripheral vertical conductor, can be formed within one of the base encapsulation holes 1238, such as the third encapsulation hole. The first peripheral vertical conductor can be formed directly on one of the peripheral non-horizontal conductive plates 1252, such as the first peripheral non-horizontal conductive plate.

Another of the peripheral vertical conductors 1262, such as a second peripheral vertical conductor, can be formed within another of the base encapsulation holes 1238, such as the fourth encapsulation hole. The second peripheral vertical conductor can be formed directly on another of the peripheral non-horizontal conductive plates 1252, such as the second peripheral non-horizontal conductive plate.

Bottom extents of the interior non-horizontal conductive plates 1246 and the peripheral non-horizontal conductive plates 1252, and the base encapsulation 1236 can be directly on the internal substrate bottom side 1220. The interior conductor bottom side 1258 and the peripheral conductor bottom side 1264 can be directly on the internal substrate bottom side 1220. The base encapsulation top side 1242 and top extents of the interior non-horizontal conductive plates 1246 and the peripheral non-horizontal conductive plates 1252 can be coplanar with each other.

Bottom extents of the heat slug 1243, the interior non-vertical conductive plates 1248, and the peripheral non-vertical conductive plates 1254 can be coplanar with each other. Top extents of the heat slug 1243, the interior non-vertical conductive plates 1248, and the peripheral non-vertical conductive plates 1254 can be coplanar with each other.

The base package 1202 can include base interconnects 1268 attached to the base substrate bottom side 1206 to provide electrical connection between the base substrate 1204 and an external system (not shown). The base interconnects 1268 are defined as electrically conductive connectors.

The integrated circuit packaging system 1200 can include a stack package 1276, which is defined as a semiconductor package. The stack package 1276 can include a stack substrate 1278, which is defined as a support structure for mounting and connecting an integrated circuit thereto including providing electrical connections through the support structure.

The stack package 1276 can include a stack integrated circuit 1280, which is defined as a semiconductor device having a number of integrated transistors interconnected to form active circuits. The stack integrated circuit 1280 can be mounted over the stack substrate 1278. An inactive side of the stack integrated circuit 1280 can be attached to the stack substrate 1278 with a stack attach layer 1282, which is defined as a layer formed with an attach material for attaching an integrated circuit.

The stack package 1276 can include stack connectors 1284 attached to an active side of the stack integrated circuit 1280 and the stack substrate 1278. The stack package 1276 can include a stack encapsulation 1286, which is defined as a package cover of a semiconductor package to seal an integrated circuit providing mechanical and environmental protection. The stack encapsulation 1286 can be formed over and covering the stack substrate 1278, the stack integrated circuit 1280, the stack attach layer 1282, and the stack connectors 1284.

The stack package 1276 can include stack interconnects 1288 attached to the stack substrate 1278. The stack interconnects 1288 are defined as electrically conductive connectors. The stack package 1276 can be mounted over the base package 1202 with the stack interconnects 1288 attached directly on the interior vertical conductors 1256 and the peripheral vertical conductors 1262 to provide electrical connection between the stack substrate 1278 and the base package 1202.

It has been discovered that the interior vertical conductors 1256 directly on the interior non-horizontal conductive plates 1246 and the peripheral vertical conductors 1262 directly on the peripheral non-horizontal conductive plates 1252 provide robust structural integrity thereby eliminating warpage.

It has been unexpectedly found that the interior non-horizontal conductive plates 1246 and the peripheral non-horizontal conductive plates 1252 directly on the base encapsulation interior sidewalls 1240 provide reduced horizontal length profile with the interior non-horizontal conductive plates 1246 and the peripheral non-horizontal conductive plates 1252 having reduced thicknesses, resulting in reduced manufacturing cost.

It has been unexpectedly determined that the base encapsulation 1236 between the interior non-horizontal conductive plates 1246 and the peripheral non-horizontal conductive plates 1252 improves reliability by eliminating solder ball bridges between top solder balls to be attached to the interior vertical conductors 1256 and the peripheral vertical conductors 1262 when a top package is mounted over the base package 1202.

It has been unexpectedly recognized that the interior vertical conductors 1256 and the peripheral vertical conductors 1262 provide reduced pitch with the interior vertical conductors 1256 and the peripheral vertical conductors 1262 formed with column shapes having reduced horizontal widths.

It has been unexpectedly ascertained that the interior shield structure 1244 and the peripheral shield structures 1250 directly on the base encapsulation top side 1242 provide improved reliability since the interior shield structure 1244 and the peripheral shield structures 1250 provide improved electromagnetic shielding thereby eliminating electromagnetic interferences.

It has been unexpectedly identified that the internal integrated circuit 1224 provides improved reliability since it the internal integrated circuit 1224 is a known good die (KGD), resulting in increased yield.

It has been unexpectedly observed that the interior vertical conductors 1256 and the peripheral vertical conductors 1262 improve reliability since the interior vertical conductors 1256 and the peripheral vertical conductors 1262 are formed with solder having improved joints with pads at the internal substrate top side 1222 compared to copper.

It has been unexpectedly detected that the heat slug 1243 directly on the base encapsulation top side 1242 provides improved reliability by conducting heat away from the internal package 1216.

Figure 13:
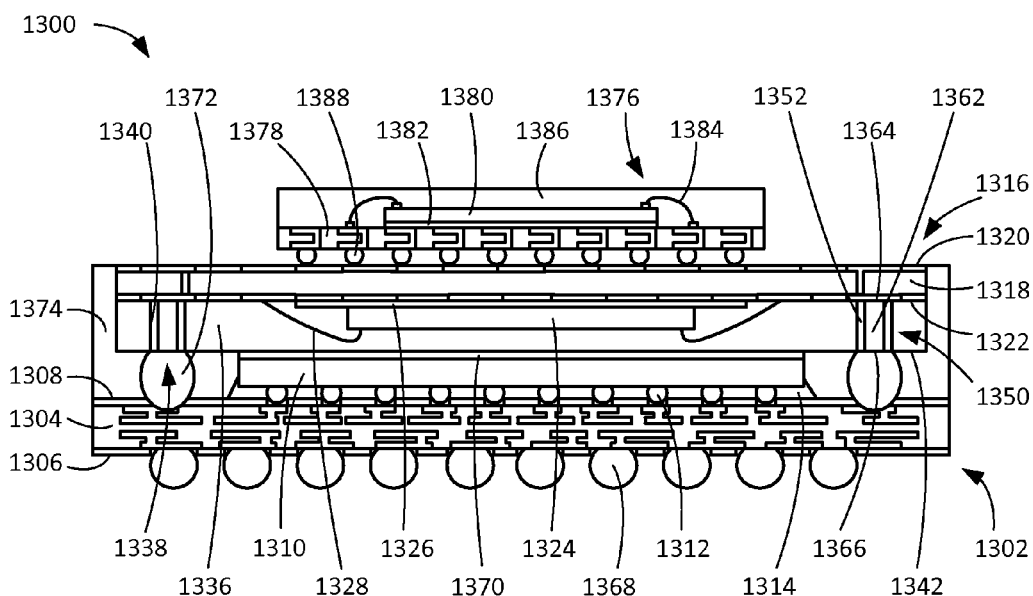
FIG. 13 is a cross-sectional view of an integrated circuit packaging system in a third embodiment of the present invention.

Referring now to FIG. 13, therein is shown a cross-sectional view of an integrated circuit packaging system 1300 in a third embodiment of the present invention. The integrated circuit packaging system 1300 can represent a package-in-package (PIP) package.

The integrated circuit packaging system 1300 can include a base package 1302, which is defined as a semiconductor package. The base package 1302 can include a base substrate 1304 having a base substrate bottom side 1306 and a base substrate top side 1308 opposite the base substrate bottom side 1306. The base substrate 1304 is defined as a support structure for mounting and connecting an integrated circuit thereto including providing electrical connections through the support structure.

The base package 1302 can include a base integrated circuit 1310, which is defined as a semiconductor device having a number of integrated transistors interconnected to form active circuits. The base integrated circuit 1310 can be mounted over the base substrate 1304.

The base package 1302 can include first base connectors 1312 attached to an active side of the base integrated circuit 1310 and the base substrate top side 1308. The first base connectors 1312 are defined as electrically conductive connectors for connecting an integrated circuit to another system level.

The base package 1302 can include an underfill 1314 formed between the base substrate top side 1308 and the active side of the base integrated circuit 1310. The underfill 1314 can cover the first base connectors 1312 to provide protection to the first base connectors 1312.

The integrated circuit packaging system 1300 can include an internal package 1316, which is defined as a semiconductor package. The internal package 1316 can include an internal substrate 1318 having an internal substrate bottom side 1320 and an internal substrate top side 1322 opposite the internal substrate bottom side 1320.

The internal substrate 1318 is defined as a support structure for mounting and connecting an integrated circuit thereto including providing electrical connections through the support structure. The internal substrate 1318 can include a number of pads, vias, conductive layers, or a combination thereof to provide electrical connectivity between the internal substrate bottom side 1320 and the internal substrate top side 1322.

The internal package 1316 can include an internal integrated circuit 1324, which is defined as a semiconductor device having a number of integrated transistors interconnected to form active circuits. The internal integrated circuit 1324 can be mounted over the internal substrate 1318 with an internal attach layer 1326, which is defined as a layer formed with an attach material for attaching an integrated circuit.

The internal package 1316 can include internal connectors 1328 attached to the internal integrated circuit 1324 and the internal substrate 1318. The internal connectors 1328 are defined as electrically conductive connectors for connecting an integrated circuit to another component or another system level.

The internal package 1316 can include an internal encapsulation 1336, which is defined as a package cover of a semiconductor package to seal an integrated circuit providing mechanical and environmental protection. The internal encapsulation 1336 can be formed over and covering the internal substrate top side 1322, the internal integrated circuit 1324, the internal attach layer 1326, and the internal connectors 1328.

The internal encapsulation 1336 can include internal encapsulation holes 1338, which are vertical openings through the internal encapsulation 1336. The internal encapsulation 1336 can include internal encapsulation interior sidewalls 1340, which are defined as internal sides of the internal encapsulation 1336 that horizontally bound the internal encapsulation holes 1338. The internal encapsulation 1336 can include an internal encapsulation top side 1342, which is defined as a top extent of the internal encapsulation 1336.

The internal package 1316 can include peripheral shield structures 1350 having peripheral non-horizontal conductive plates 1352. The peripheral shield structures 1350 are defined as structures that shield electromagnetic interferences. Each of the peripheral shield structures 1350 can be integrally formed with one of the peripheral non-horizontal conductive plates 1352.

The peripheral shield structures 1350 can be formed at exterior portions of the internal package 1316. The peripheral shield structures 1350 can provide thermal conduction paths for heat to dissipate away from the internal integrated circuit 1324, and through the internal substrate 1318 and the internal encapsulation 1336 to the peripheral shield structures 1350.

One of the peripheral shield structures 1350, such as a first peripheral shield structure, can be adjacent the internal integrated circuit 1324. Another of the peripheral shield structures 1350, such as a second peripheral shield structure, can be adjacent the internal integrated circuit 1324.

The peripheral non-horizontal conductive plates 1352 are defined as conductive layers formed at an exterior portion of the internal package 1316. The peripheral non-horizontal conductive plates 1352 can be formed horizontally surrounding the internal integrated circuit 1324.

One of the peripheral non-horizontal conductive plates 1352, such as a first peripheral non-horizontal conductive plate, can be adjacent the internal integrated circuit 1324. Another of the peripheral non-horizontal conductive plates 1352, such as a second peripheral non-horizontal conductive plate, can be adjacent the internal integrated circuit 1324.

One of the peripheral non-horizontal conductive plates 1352, such as the first peripheral non-horizontal conductive plate, can be formed within one of the internal encapsulation holes 1338, such as a first encapsulation hole. The first peripheral non-horizontal conductive plate can be directly on one of the internal encapsulation interior sidewalls 1340, such as a first encapsulation interior sidewall.

Another of the peripheral non-horizontal conductive plates 1352, such as the second peripheral non-horizontal conductive plate, can be formed within another of the internal encapsulation holes 1338, such as a second encapsulation hole. The second peripheral non-horizontal conductive plate can be directly on another of the internal encapsulation interior sidewalls 1340, such as a second encapsulation interior sidewall.

For a specific example, the peripheral non-horizontal conductive plates 1352 can be formed vertically extending from the internal substrate top side 1322 to the internal encapsulation top side 1342. For another specific example, the peripheral non-horizontal conductive plates 1352 can include planar surfaces.

The internal package 1316 can include peripheral vertical conductors 1362, each of which can include a peripheral conductor bottom side 1364 and a peripheral conductor top side 1366 opposite the peripheral conductor bottom side 1364. The peripheral vertical conductors 1362 are defined as electrically conductive connectors that connect the internal integrated circuit 1324 to another system level. The internal substrate 1318 can provide an electrical path between the peripheral vertical conductors 1362 and the internal integrated circuit 1324. The peripheral conductor bottom side 1364 and the peripheral conductor top side 1366 are defined as bottom and top extents, respectively, of each of the peripheral vertical conductors 1362.

One of the peripheral vertical conductors 1362, such as a first peripheral vertical conductor, can be formed within one of the internal encapsulation holes 1338, such as the first encapsulation hole. The first peripheral vertical conductor can be formed directly on one of the peripheral non-horizontal conductive plates 1352, such as the first peripheral non-horizontal conductive plate.

Another of the peripheral vertical conductors 1362, such as a second peripheral vertical conductor, can be formed within another of the internal encapsulation holes 1338, such as the second encapsulation hole. The second peripheral vertical conductor can be formed directly on another of the peripheral non-horizontal conductive plates 1352, such as the second peripheral non-horizontal conductive plate. The internal integrated circuit 1324 can be between the second peripheral vertical conductor and the first peripheral vertical conductor.

Bottom extents of the peripheral non-horizontal conductive plates 1352 and the internal encapsulation 1336 can be directly on the internal substrate top side 1322. The peripheral conductor bottom side 1364 can be directly on the internal substrate top side 1322. The internal encapsulation top side 1342 and top extents of the peripheral non-horizontal conductive plates 1352 can be coplanar with each other.

The base package 1302 can include base interconnects 1368 attached to the base substrate bottom side 1306 to provide electrical connection between the base substrate 1304 and an external system (not shown). The base interconnects 1368 are defined as electrically conductive connectors.

The base package 1302 can include a base attach layer 1370 attached to a top side of the internal encapsulation 1336 and an inactive side of the base integrated circuit 1310 with the internal package 1316 in a vertically inverted position. The base package 1302 can include second base connectors 1372 electrically connected or attached to the peripheral conductor top side 1366 of each of the peripheral vertical conductors 1362 and the base substrate top side 1308. The second base connectors 1372 can surround the base integrated circuit 1310.

The base package 1302 can include a base encapsulation 1374, which is defined as a package cover of a semiconductor package to seal an integrated circuit providing mechanical and environmental protection. The base encapsulation 1374 can be formed over the base substrate 1304, the base integrated circuit 1310, the underfill 1314, a portion of the internal package 1316, the base attach layer 1370, and the second base connectors 1372.

A top side of the base encapsulation 1374 can be coplanar with the internal substrate bottom side 1320. The base encapsulation 1374 can be formed with a thermally conductive material for providing heat conduction away from the base integrated circuit 1310 and the internal package 1316.

The integrated circuit packaging system 1300 can include a stack package 1376, which is defined as a semiconductor package. The stack package 1376 can include a stack substrate 1378, which is defined as a support structure for mounting and connecting an integrated circuit thereto including providing electrical connections through the support structure.

The stack package 1376 can include a stack integrated circuit 1380, which is defined as a semiconductor device having a number of integrated transistors interconnected to form active circuits. The stack integrated circuit 1380 can be mounted over the stack substrate 1378. An inactive side of the stack integrated circuit 1380 can be attached to the stack substrate 1378 with a stack attach layer 1382, which is defined as a layer formed with an attach material for attaching an integrated circuit.

The stack package 1376 can include stack connectors 1384 attached to an active side of the stack integrated circuit 1380 and the stack substrate 1378. The stack package 1376 can include a stack encapsulation 1386, which is defined as a package cover of a semiconductor package to seal an integrated circuit providing mechanical and environmental protection. The stack encapsulation 1386 can be formed over and covering the stack substrate 1378, the stack integrated circuit 1380, the stack attach layer 1382, and the stack connectors 1384.

The stack package 1376 can include stack interconnects 1388 attached to the stack substrate 1378. The stack interconnects 1388 are defined as electrically conductive connectors. The stack package 1376 can be mounted over the base package 1302 with the stack interconnects 1388 attached directly on the internal substrate bottom side 1320 to provide electrical connection between the stack substrate 1378 and the base package 1302.

It has been discovered that the peripheral vertical conductors 1362 directly on the peripheral non-horizontal conductive plates 1352 provide robust structural integrity thereby eliminating warpage.

It has been unexpectedly found that the peripheral non-horizontal conductive plates 1352 directly on the internal encapsulation interior sidewalls 1340 provide reduced horizontal length profile with the peripheral non-horizontal conductive plates 1352 having reduced thickness, resulting in reduced manufacturing cost.

It has been unexpectedly recognized that the peripheral vertical conductors 1362 provide reduced pitch with the peripheral vertical conductors 1362 formed with column shapes having reduced horizontal widths.

It has been unexpectedly identified that the internal integrated circuit 1324 provides improved reliability since the internal integrated circuit 1324 is a known good die (KGD), resulting in increased yield.

It has been unexpectedly observed that the peripheral vertical conductors 1362 improve reliability since the peripheral vertical conductors 1362 are formed with solder having improved joints with pads at the internal substrate top side 1322 compared to copper.

Figure 14:
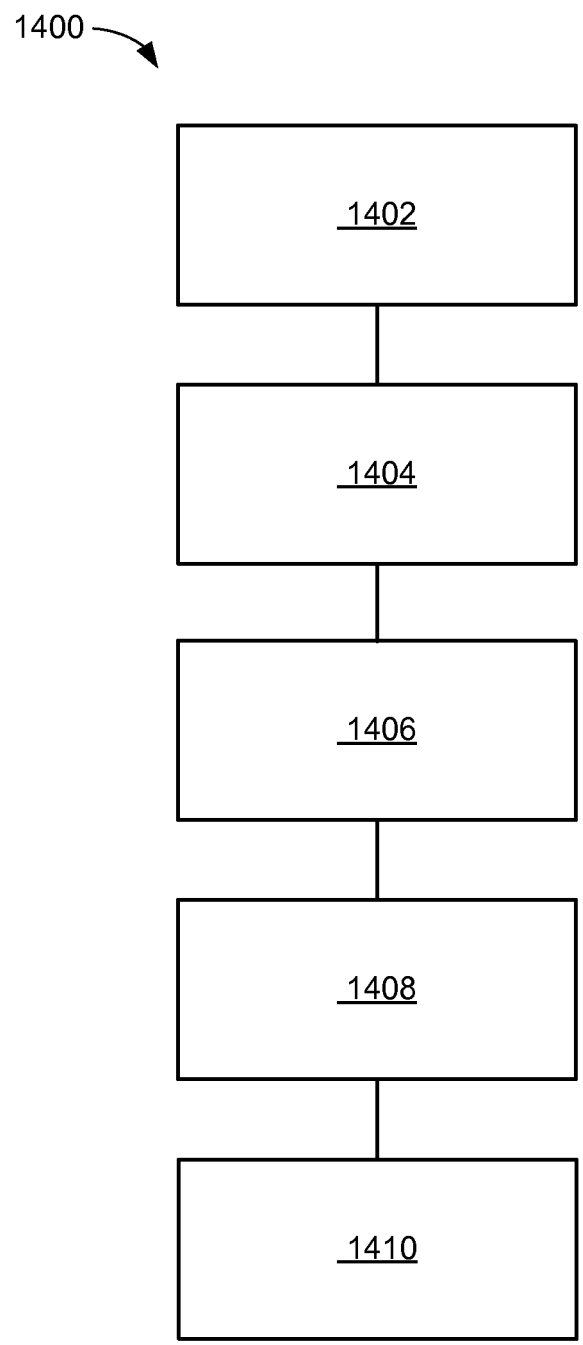
FIG. 14 is a flow chart of a method of manufacture of an integrated circuit packaging system in a further embodiment of the present invention.

Referring now to FIG. 14, therein is shown a flow chart of a method 1400 of manufacture of an integrated circuit packaging system in a further embodiment of the present invention. The method 1400 includes: providing a substrate in a block 1402; mounting an integrated circuit over the substrate in a block 1404; forming an encapsulation over the integrated circuit, the encapsulation having an encapsulation interior sidewall in a block 1406; forming a peripheral non-horizontal conductive plate directly on the encapsulation interior sidewall in a block 1408; and forming a peripheral vertical conductor directly on the peripheral non-horizontal conductive plate and the substrate in a block 1410.

Thus, it has been discovered that the integrated circuit packaging system of the present invention furnishes important and heretofore unknown and unavailable solutions, capabilities, and functional aspects for an integrated circuit packaging system with interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   mounting an integrated circuit over the substrate;
   forming an encapsulation over the integrated circuit, the encapsulation having an encapsulation interior sidewall;
   attaching a heat slug to the integrated circuit;
   forming an interior non-vertical conductive plate coplanar with the heat slug, surrounding the heat slug, and above the integrated circuit;
   forming a peripheral non-horizontal conductive plate directly on the encapsulation interior sidewall;
   forming a peripheral vertical conductor directly on the peripheral non-horizontal conductive plate and the substrate; and
   forming an interior vertical conductor away from the peripheral vertical conductor and between the peripheral vertical conductor and the integrated circuit.

2. The method as claimed in claim 1 wherein forming the peripheral non-horizontal conductive plate includes forming the peripheral non-horizontal conductive plate coplanar with an encapsulation top side of the encapsulation.

3. The method as claimed in claim 1 further comprising forming an interior non-horizontal conductive plate adjacent the peripheral non-horizontal conductive plate.

4. The method as claimed in claim 1 wherein forming the peripheral vertical conductor includes forming the peripheral vertical conductor directly on a substrate bottom side of the substrate.

5. The method as claimed in claim 1 further comprising forming a second peripheral vertical conductor directly on the substrate with the integrated circuit between the second peripheral vertical conductor and the peripheral vertical conductor.

6. A method of manufacture of an integrated circuit packaging system comprising:
   providing a substrate;
   mounting an integrated circuit over the substrate;
   forming an encapsulation over the integrated circuit, the encapsulation having an encapsulation hole horizontally bounded by an encapsulation interior sidewall;
   attaching a heat slug to the integrated circuit;
   forming an interior non-vertical conductive plate coplanar with the heat slug, surrounding the heat slug, and above the integrated circuit;
   forming a peripheral non-horizontal conductive plate within the encapsulation hole and directly on the encapsulation interior sidewall;
   forming a peripheral vertical conductor directly on the peripheral non-horizontal conductive plate and the substrate; and forming an interior vertical conductor away from the peripheral vertical conductor and between the peripheral vertical conductor and the integrated circuit.

7. The method as claimed in claim 6 wherein forming the peripheral vertical conductor includes forming the peripheral vertical conductor coplanar with the peripheral non-horizontal conductive plate and an encapsulation top side of the encapsulation.

8. The method as claimed in claim 6 further comprising forming an interior non-horizontal conductive plate adjacent the peripheral non-horizontal conductive plate and the integrated circuit.

9. The method as claimed in claim 6 wherein:
forming the interior vertical conductor includes forming the interior vertical conductor directly on a substrate bottom side of the substrate; and
forming the peripheral vertical conductor includes forming the peripheral vertical conductor directly on the substrate bottom side and adjacent the interior vertical conductor.

10. The method as claimed in claim 6 further comprising forming a second peripheral vertical conductor directly on a substrate top side of the substrate with the integrated circuit between the second peripheral vertical conductor and the peripheral vertical conductor.

11. An integrated circuit packaging system comprising:
a substrate;
an integrated circuit over the substrate;
an encapsulation over the integrated circuit, the encapsulation having an encapsulation interior sidewall;
a heat slug attached to the integrated circuit;
an interior non-vertical conductive plate coplanar with the heat slug, surrounding the heat slug, and above the integrated circuit;
a peripheral non-horizontal conductive plate directly on the encapsulation interior sidewall;
a peripheral vertical conductor directly on the peripheral non-horizontal conductive plate and the substrate; and
an interior vertical conductor away from the peripheral vertical conductor and between the peripheral vertical conductor and the integrated circuit.

12. The system as claimed in claim 11 wherein the peripheral non-horizontal conductive plate is coplanar with an encapsulation top side of the encapsulation.

13. The system as claimed in claim 11 further comprising an interior non-horizontal conductive plate adjacent the peripheral non-horizontal conductive plate.

14. The system as claimed in claim 11 wherein the peripheral vertical conductor is directly on a substrate bottom side of the substrate.

15. The system as claimed in claim 11 further comprising a second peripheral vertical conductor directly on the substrate with the integrated circuit between the second peripheral vertical conductor and the peripheral vertical conductor.

16. The system as claimed in claim 11 wherein:
the encapsulation includes an encapsulation hole horizontally bounded by the encapsulation interior sidewall; and
the peripheral non-horizontal conductive plate is within the encapsulation hole.

17. The system as claimed in claim 16 wherein the peripheral vertical conductor is coplanar with the peripheral non-horizontal conductive plate and an encapsulation top side of the encapsulation.

18. The system as claimed in claim 16 further comprising an interior non-horizontal conductive plate adjacent the peripheral non-horizontal conductive plate and the integrated circuit.

19. The system as claimed in claim 16 wherein:
the interior vertical conductor is directly on a substrate bottom side of the substrate; and
the peripheral vertical conductor is directly on the substrate bottom side and adjacent the interior vertical conductor.

20. The system as claimed in claim 16 further comprising a second peripheral vertical conductor directly on a substrate top side of the substrate with the integrated circuit between the second peripheral vertical conductor and the peripheral vertical conductor.

\* \* \* \* \*